US012567567B2

(12) United States Patent
Kimikado

(10) Patent No.: US 12,567,567 B2
(45) Date of Patent: Mar. 3, 2026

(54) HOLDING DEVICE

(71) Applicant: Niterra Co., Ltd., Nagoya (JP)

(72) Inventor: Yasuaki Kimikado, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 234 days.

(21) Appl. No.: 18/699,641

(22) PCT Filed: Oct. 11, 2022

(86) PCT No.: PCT/JP2022/037813
§ 371 (c)(1),
(2) Date: Apr. 9, 2024

(87) PCT Pub. No.: WO2023/068099
PCT Pub. Date: Apr. 27, 2023

(65) Prior Publication Data
US 2024/0404796 A1    Dec. 5, 2024

(30) Foreign Application Priority Data

Oct. 20, 2021    (JP) ................................. 2021-171460

(51) Int. Cl.
*H01J 37/32* (2006.01)
*H01L 21/683* (2006.01)
(52) U.S. Cl.
CPC . *H01J 37/32715* (2013.01); *H01J 2237/2007* (2013.01); *H01L 21/6833* (2013.01)
(58) Field of Classification Search
CPC ......... H01J 37/32715; H01J 2237/2007; H01J 37/32724; H01L 21/6833; H01L 21/67109;

(Continued)

(56) References Cited

U.S. PATENT DOCUMENTS 6,628,503 B2 * 9/2003 Sogard .................. H01L 23/467
                                                    361/324
8,520,360 B2 * 8/2013 Singh .................. H01L 21/6831
                                                    361/234

(Continued)

FOREIGN PATENT DOCUMENTS

JP         2018148162 A  *  9/2018
JP            6621548 B2    12/2019
KR    10-2021-0087536 A    7/2021

OTHER PUBLICATIONS

Japan Patent Office, International Search Report issued in corresponding Application No. PCT/JP2022/037813 mailed Dec. 20, 2022.

(Continued)

*Primary Examiner* — Dharti H Patel
(74) *Attorney, Agent, or Firm* — Stites & Harbison, PLLC; Jeffrey A. Haeberlin

(57) ABSTRACT

A plate-shaped member of a holding device has a first surface having a gas outlet, and a second surface having a gas inlet and positioned opposite to the first surface. The plate-shaped member includes a plane-parallel gas passage extending parallel to the first surface and including a connection hole, and a gas inflow/outflow passage connected to the connection hole and providing communication between the gas outlet or the gas inlet and the plane-parallel gas passage. A porous body is disposed in the gas inflow/outflow passage and projects into the plane-parallel gas passage from the connection hole. The porous body includes a wide portion disposed in the plane-parallel gas passage. A dimension of the wide portion on a cross section taken along a plane orthogonal to the first surface is greater than a hole width of the connection hole.

8 Claims, 7 Drawing Sheets

(58) Field of Classification Search
CPC ............... H01L 21/6831; H01L 21/683; H01L
21/68785
USPC ......................................................... 361/234
See application file for complete search history.

(56) References Cited

U.S. PATENT DOCUMENTS

| | | | | |
|---|---|---|---|---|
| 12,300,473 | B2 * | 5/2025 | Cho .................. | H01L 21/67109 |
| 2006/0021574 | A1 * | 2/2006 | Armour ............ | C23C 16/45574 |
| | | | | 427/248.1 |
| 2015/0371885 | A1 * | 12/2015 | Tamagawa .......... | H01L 21/6833 |
| | | | | 361/234 |
| 2019/0252231 | A1 | 8/2019 | Takasaki | |
| 2022/0026151 | A1 * | 1/2022 | Araki ................... | F28F 9/0282 |

OTHER PUBLICATIONS

Korean Intellectual Property Office, Office Action (Request for the Submission of an Opinion) issued in corresponding Application No. 10-2023-7030241 mailed Jun. 11, 2024.

* cited by examiner

HOLDING DEVICE

TECHNICAL FIELD

The present disclosure relates to a holding device.

BACKGROUND ART

A known example of a holding device is an electrostatic chuck used in a plasma process for manufacturing a semi-conductor. In a plasma process performed on, for example, a substrate or a wafer, an insulating electrostatic chuck holding the object to be processed on an upper surface thereof is placed in a chamber (processing vessel). High-frequency electric power is applied to a conductive cooling base member disposed below the electrostatic chuck, so that a bias voltage is applied to the wafer or the like. The electrostatic chuck includes a gas passage providing com-munication between a lower surface (surface facing the cooling base member) and an upper surface (surface holding the wafer). The gas passage allows thermally conductive gas, such as helium gas, to flow from the cooling base member to the surface on which the wafer is placed. The thermally conductive gas facilitates temperature control of the surface holding the wafer.

The high-frequency electric power applied in the plasma process may cause abnormal discharge (arcing) in the gas passage. This leads to degradation in the quality of the process performed on the wafer or the like, resulting in a reduction in the yield. Therefore, it is desirable to reduce the occurrence of abnormal discharge without impeding the supply of gas. Accordingly, for example, PTL 1 listed below describes an electrostatic chuck having a plug chamber in a portion of a narrow hole serving as a gas passage. A porous insulating air permeable plug is disposed in the plug cham-ber, and is bonded and fixed to a wall surface of the plug chamber with an adhesive made of, for example, an epoxy-based resin.

CITATION LIST

Patent Literature

PTL 1: Japanese Patent No. 6621548

SUMMARY OF INVENTION

Technical Problem

In recent years, to achieve an increase in process speed, for example, the voltage of the high-frequency electric power has been increased. As a result, the potential differ-ence between the cooling base member and the wafer or the like is increased, and abnormal discharge more easily occurs in the gas passage, in particular, in a hollow space extending in a vertical direction. Therefore, the insulating porous body used to reduce the abnormal discharge is preferably disposed to extend to regions close to a gas outlet and a gas inlet formed in an upper surface and a lower surface of the electrostatic chuck. When the porous body is disposed to extend to the upper and lower surfaces of the electrostatic chuck, there is a possibility that the porous body will be released into a processing space from the gas passage when the chamber is evacuated in the plasma process or pressur-ized at a certain pressure to cause the thermally conductive gas to flow.

The porous body may be held in the gas passage by, for example, fixing the porous body to a wall surface of the gas passage with a resin adhesive layer, as described in PTL 1. However, this is not preferred because the resin adhesive layer is easily damaged by plasma and generates particles. The generated particles may cause degradation in the quality of the process performed on the wafer or the like, or enter the porous body and impede the flow of gas. Accordingly, there has been a desire to hold the insulating porous body in the gas passage without using a resin adhesive. Although a ceramic-based adhesive may be used, the ceramic-based adhesive contains an alkali metal (for example, an Na component) that may adversely affect the quality.

In light of the above-described circumstances, an object of the present technology is to provide a holding device capable of holding a porous body, which is used to reduce the occurrence of abnormal discharge, in a gas passage without using a resin adhesive or the like.

Solution to Problem

A holding device according to the present disclosure includes a plate-shaped member that has insulating proper-ties and that has a first surface and a second surface, the first surface being configured to hold an object, the second surface being at a side opposite to a side of the first surface. The plate-shaped member includes therein: a plane-parallel gas passage extending parallel to the first surface; a first gas passage connected to a first connection hole provided in a wall surface of the plane-parallel gas passage, the first gas passage providing communication between a gas outlet provided in the first surface and the plane-parallel gas passage; and a second gas passage connected to a second connection hole provided in a wall surface of the plane-parallel gas passage, the second gas passage providing communication between a gas inlet provided in the second surface and the plane-parallel gas passage. A porous body that has insulating properties is disposed in at least one of the first gas passage or the second gas passage, the porous body projecting into the plane-parallel gas passage from the first connection hole or the second connection hole. The porous body includes a wide portion, a dimension of the wide portion in a direction parallel to the first surface on a cross section taken along a plane orthogonal to the first surface is greater than a hole width of the first connection hole or the second connection hole in which the porous body is dis-posed. The wide portion is disposed in the plane-parallel gas passage.

Advantageous Effects of Invention

The present disclosure provides a holding device capable of holding a porous body, which is used to reduce the occurrence of abnormal discharge, in a gas passage without using a resin adhesive or the like.

DESCRIPTION OF EMBODIMENTS

Description of Embodiments of Present Disclosure

Figure 1:
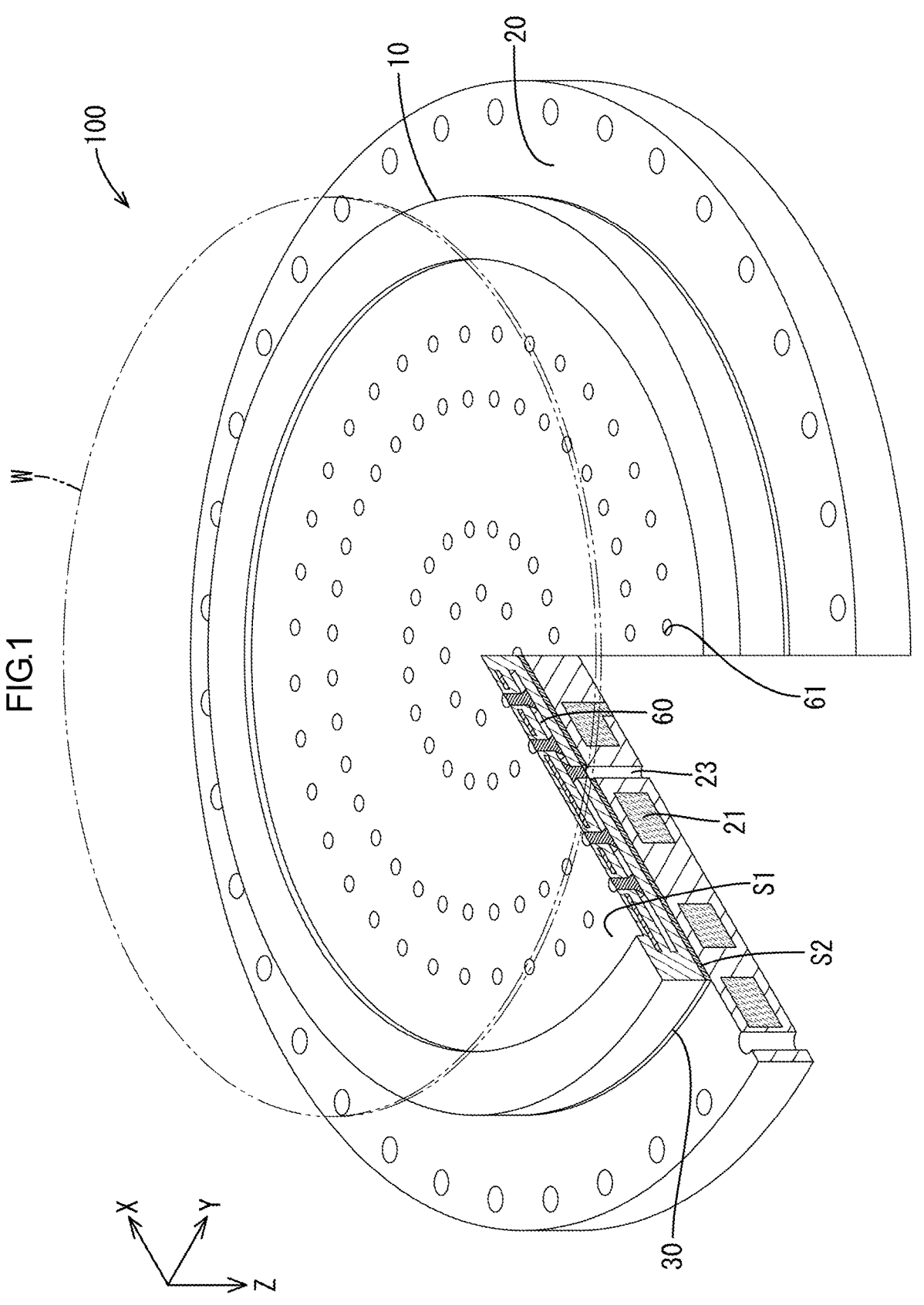
FIG. 1 is a partially broken perspective view schemati-cally illustrating the structure of a holding device according to a first embodiment.

Embodiments of the present disclosure are as follows.

<1> A holding device according to the present disclosure includes a plate-shaped member that has insulating properties and that has a first surface and a second surface, the first surface being configured to hold an object, the second surface being at a side opposite to a side of the first surface. The plate-shaped member includes therein: a plane-parallel gas passage extending parallel to the first surface; a first gas passage connected to a first connection hole provided in a wall surface of the plane-parallel gas passage, the first gas passage providing communication between a gas outlet provided in the first surface and the plane-parallel gas passage; and a second gas passage connected to a second connection hole provided in a wall surface of the plane-parallel gas passage, the second gas passage providing communication between a gas inlet provided in the second surface and the plane-parallel gas passage. A porous body that has insulating properties is disposed in at least one of the first gas passage or the second gas passage, the porous body projecting into the plane-parallel gas passage from the first connection hole or the second connection hole. The porous body includes a wide portion, a dimension of the wide portion in a direction parallel to the first surface on a cross section taken along a plane orthogonal to the first surface is greater than a hole width of the first connection hole or the second connection hole in which the porous body is disposed. The wide portion is disposed in the plane-parallel gas passage. The first surface S1 above the plate-shaped member 10 may be an uneven surface having projections on which a wafer W is to be mounted.

<2> In the holding device according to <1>, the first connection hole and the second connection hole are disposed at positions shifted from each other when viewed in a direction normal to the first surface.

<3> In the holding device according to <2>, the porous body is present in a region extending from the first connection hole or the second connection hole in which the porous body is disposed to a facing wall surface positioned at a side facing the first connection hole or the second connection hole in which the porous body is disposed in the plane-parallel gas passage.

<4> In the holding device according to <3>, in the plane-parallel gas passage, the porous body is present in a region extending along a connection wall surface positioned at a side at which the first connection hole or the second connection hole in which the porous body is disposed is formed.

<5> In the holding device according to any one of <1> to <4>, the porous body is integrated with the plate-shaped member.

<6> In the holding device according to any one of <1> to <5>, the plane-parallel gas passage includes: a porous-body passage in which the porous body is disposed; a first plane-parallel gas passage that provides communication between the first connection hole and the porous-body passage or between the second connection hole and the porous-body passage; and a second plane-parallel gas passage that branches from the first plane-parallel gas passage and that is connected to the porous-body passage at a position different from the first plane-parallel gas passage, the second plane-parallel gas passage providing communication between the first plane-parallel gas passage and the porous-body passage.

<7> In the holding device according to <6>, the second plane-parallel gas passage is loop-shaped and extends along an outer edge of the wide portion from an end of the first plane-parallel gas passage, the end being adjacent to the wide portion.

<8> In the holding device according to any one of <1> to <7>, the plate-shaped member includes therein at least one of an electrode disposed between the first surface and the plane-parallel gas passage and an electrode disposed between the second surface and the plane-parallel gas passage. The at least one of the electrodes has a through hole through which the first gas passage or the second gas passage passes with a predetermined interval provided between the at least one of the electrodes and a wall surface of the first gas passage or the second gas passage. The wide portion is disposed in the plane-parallel gas passage to overlap the through hole when viewed in a direction normal to the first surface.

Detailed Description of Embodiments of Present Disclosure

Figure 2:
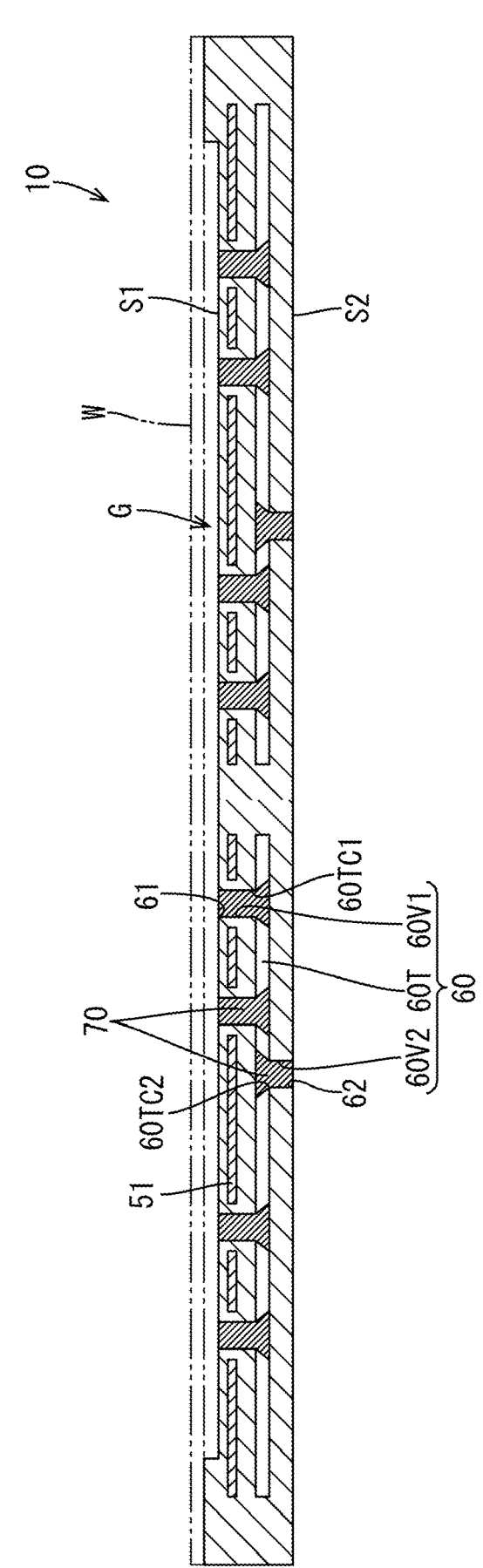
FIG. 2 is a sectional view schematically illustrating the internal structure of a plate-shaped member.
Figure 3:
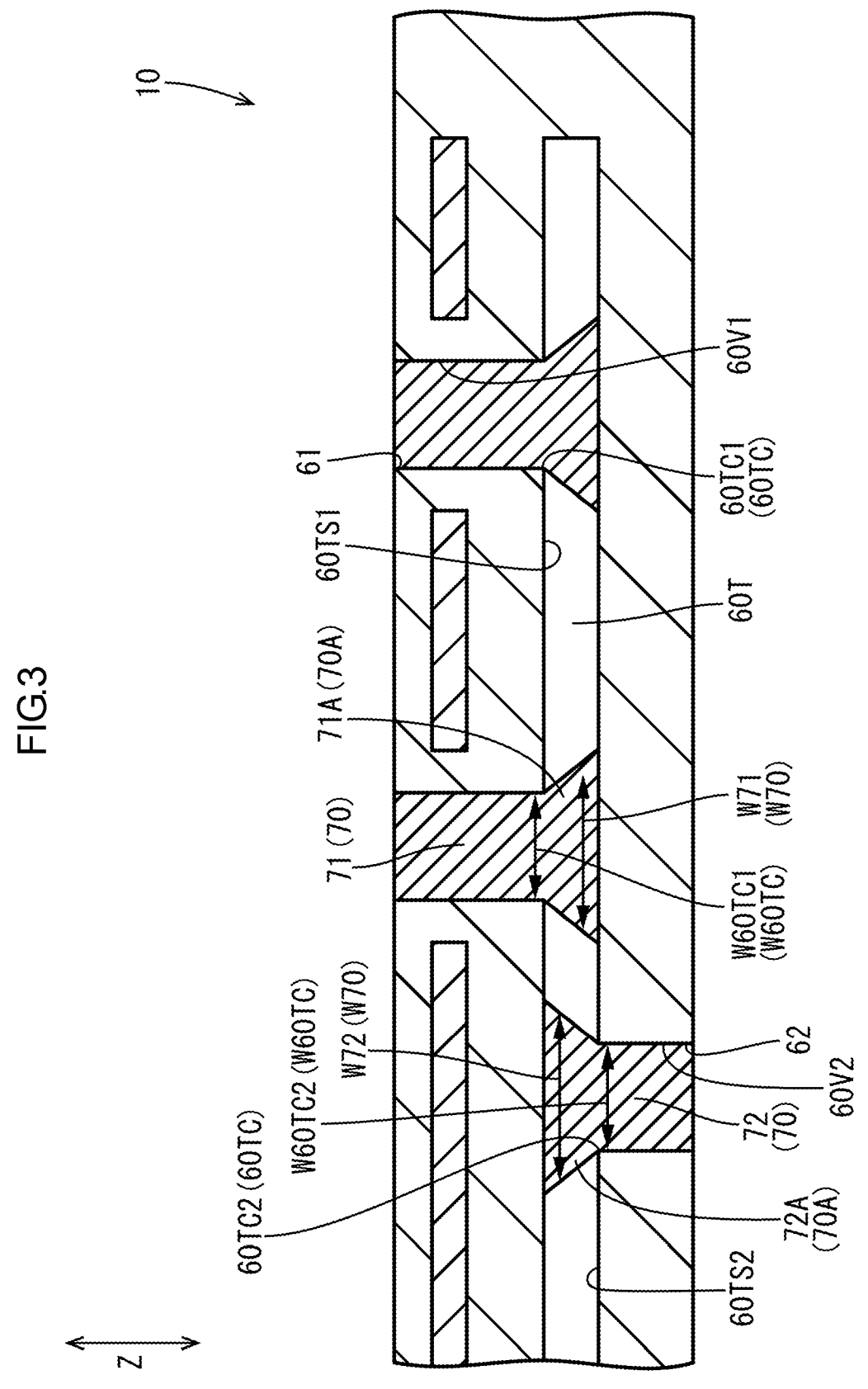
FIG. 3 is an enlarged sectional view of a part of FIG. 2.
Figure 5:
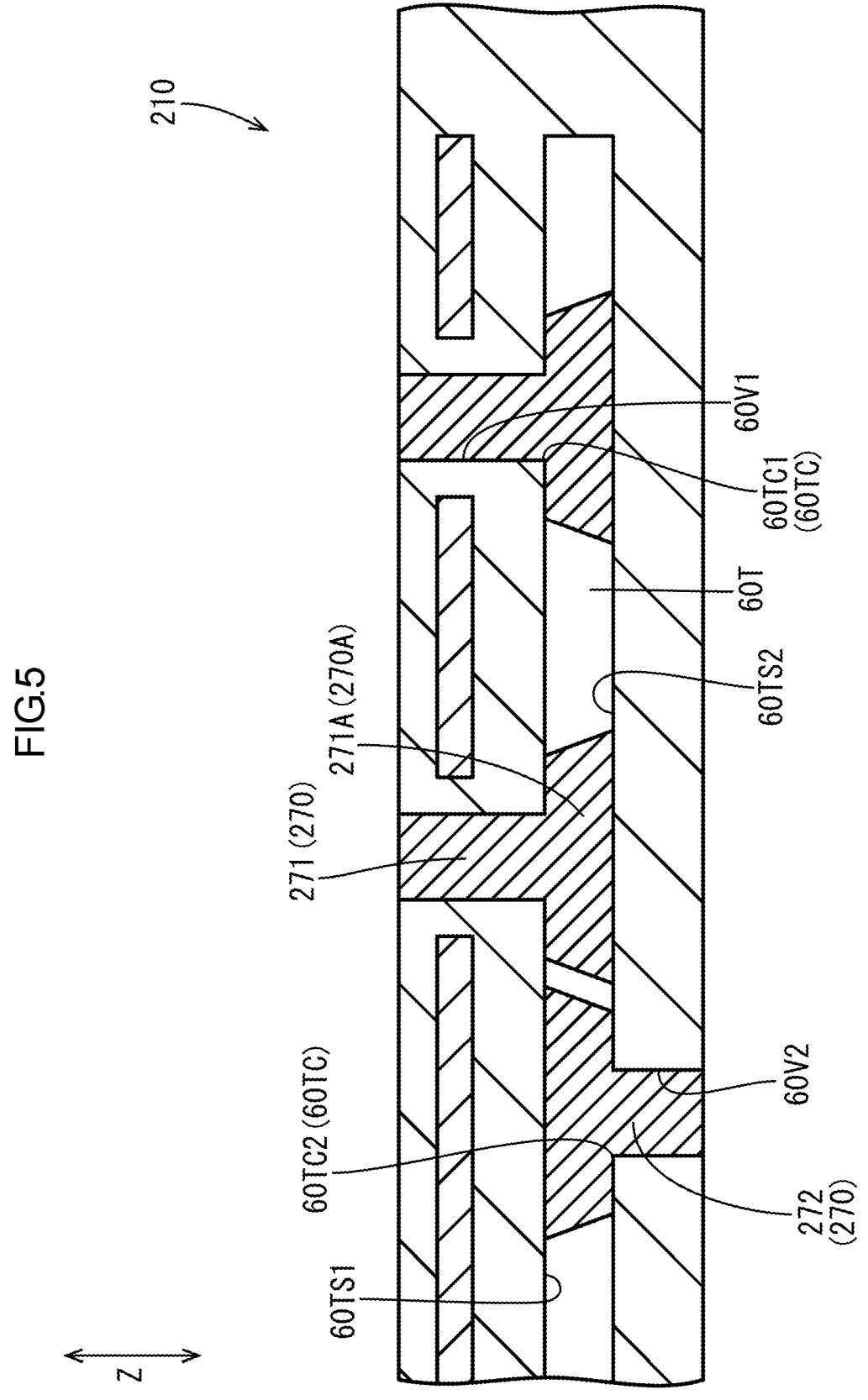
FIG. 5 is an enlarged sectional view of a part of a plate-shaped member according to a second embodiment in which porous bodies are disposed.

Examples of holding devices according to the present disclosure will now be described with reference to the drawings. The present disclosure is not limited to these examples, but is defined by the claims, and intended to include all modifications within the meaning and scope equivalent to the claims. Some of the figures show X-axis, Y-axis, and Z-axis of a Cartesian coordinate system XYZ, and are drawn so that the axial directions are the same in each figure. In the following description, an upper front region in FIG. 1 and upper regions in FIGS. 2, 3, and 5 are defined as upper regions. In figures showing a plurality of identical elements, only one of the elements may be denoted by a reference sign while the reference sign is omitted for the other elements. The relative sizes and arrangements of the elements in the figures are not always accurate, and scales, for example, of some elements may be changed for convenience of explanation. In the following description, the terms "parallel" and "orthogonal" do not necessarily mean that elements are strictly in such a positional relationship, and include arrangements in which the elements are "substantially parallel" and "substantially orthogonal" without departing from the gist of the present disclosure.

Detailed Description of First Embodiment

A holding device 100 according to a first embodiment will now be described with reference to FIGS. 1 to 4. The holding device 100 is an electrostatic chuck that attracts and holds an object (for example, a semiconductor wafer W) by electrostatic attraction while heating the object to a predetermined process temperature (for example, 50° C. to 400° C.). The electrostatic chuck is used as a table on which the wafer W is placed in, for example, a process of performing etching or the like using plasma in a low pressure chamber.

FIG. 1 schematically illustrates the structure of the holding device 100. The holding device 100 includes a plate-shaped member 10 that is disc-shaped, and a base member 20 that is also disc-shaped. The base member 20 has a diameter greater than that of the plate-shaped member 10. For example, when the plate-shaped member 10 has the shape of a disc with a diameter of 300 mm and a thickness of 3 mm, the base member 20 may have the shape of a disc having a diameter of 340 mm and a thickness of 20 mm. The plate-shaped member 10 and the base member 20 are both generally disc-shaped, and may have, for example, projections and recesses for positioning. The plate-shaped member 10 and the base member 20 are arranged in a vertical direction (Z-axis direction), and are joined together by a joining material 30. A first surface S1 at the upper side of the plate-shaped member 10 serves as an attraction surface that attracts and holds the wafer W, and a second surface S2 at a lower side of the plate-shaped member 10 is joined to the base member 20 with the joining material 30 provided therebetween.

As illustrated in an XY sectional view of FIG. 2, the plate-shaped member 10 is oriented so that the first surface S1 and the second surface S2 are substantially orthogonal to the vertical direction (Z-axis direction). The plate-shaped member 10 is an insulating substrate, and is formed of, for example, a ceramic containing aluminum nitride (AlN) or alumina ($Al_2O_3$) as a main component. Here, the main component means a component with the highest content ratio (weight ratio).

As illustrated in FIG. 1, the first surface S1 of the plate-shaped member 10 has a plurality of gas outlets 61, and the second surface S2 of the plate-shaped member 10 has a gas inlet 62 (see FIG. 2). The plate-shaped member 10 has a gas passage 60 formed therein. The gas passage 60 allows fluid to flow therethrough between the gas inlet 62 and the gas outlets 61. The first surface S1 has an outer peripheral edge portion that projects slightly upward from an inner portion. When the wafer W is attracted to and held on the first surface S1, a gap G is formed between the wafer W and the first surface S1, as illustrated in FIG. 2.

Thermally conductive gas, such as helium gas, is caused to flow through the gas passage 60 in the plate-shaped member 10. The gas is introduced through the gas inlet 62 from a gas introduction passage 23 in the base member 20, which will be described below. The introduced gas passes through the gas passage 60 and flows out through the gas outlets 61, thereby filling the gap G between the plate-shaped member 10 and the wafer W. Thus, the temperature of the first surface S1 is easily transferred to the wafer W, so that temperature control of the wafer W is facilitated. The internal structure of the plate-shaped member 10 including the gas passage 60 will be described below.

The joining material 30 may be, for example, a bonding sheet containing a silicone-based organic binder, an inorganic binder, or an Al-based metal adhesive. Preferably, the joining material 30 is highly adhesive to both the plate-shaped member 10 and the base member 20, and has a high heat resistance and a high thermal conductivity. The joining material 30 has a hole at a position such that the hole faces the gas inlet 62 in the plate-shaped member 10 and is connected to the gas introduction passage 23 in the base member 20 described below. Thus, gas introduced into the gas introduction passage 23 can pass through the hole in the joining material 30 and flow into the gas passage 60.

As illustrated in FIG. 1, the base member 20 is joined to the lower side, that is, the second surface S2, of the plate-shaped member 10 by the joining material 30. The base member 20 is a conductive base material, and may be made of, for example, a material containing aluminum, an aluminum alloy, a metal-ceramic composite (Al—SiC), or a ceramic (SiC) as the main component. In a plasma process performed on the wafer W, high-frequency electric power is applied to the base member 20, so that a bias voltage is applied to the wafer W. As described above, the base member 20 is disc-shaped and has a diameter greater than that of the plate-shaped member 10. Therefore, the entirety of the plate-shaped member 10 is placed on the base member 20.

As illustrated in FIG. 1, refrigerant passages 21 are formed in the base member 20. Refrigerant, such as water or fluorine-based inert liquid, is caused to flow through the refrigerant passages 21 to reduce plasma heat. When the refrigerant flows through the refrigerant passages 21, the base member 20 is cooled, so that the plate-shaped member 10 is cooled due to heat conduction through the joining material 30. Accordingly, the wafer W held on the first surface S1 of the plate-shaped member 10 is cooled. The temperature of the wafer W can be controlled by adjusting the flow of the refrigerant.

As illustrated in FIG. 1, the gas introduction passage 23 that allows fluid to flow therethrough is also provided in the base member 20. The gas introduction passage 23 opens in the lower surface of the base member 20, and communicates with the gas passage 60 in the plate-shaped member 10 through the hole in the joining material 30. The thermally conductive gas is introduced into the gas passage 60 from the gas introduction passage 23.

The internal structure of the plate-shaped member 10 will now be described with reference to FIGS. 2 and 3.

As described above, the gas passage 60 that provides communication between each gas outlet 61 and the gas inlet 62 is formed in the plate-shaped member 10. As illustrated in FIG. 2, the gas passage 60 according to the present embodiment includes a plane-parallel gas passage 60T, a plurality of first gas passages 60V1, and a second gas passage 60V2. In the following description, the first gas passages 60V1 and the second gas passage 60V2 will be generically referred to as gas inflow/outflow passages 60V when it is not necessary to distinguish between them.

The plane-parallel gas passage 60T is a tunnel-shaped gas passage portion extending in a horizontal direction, that is, in a direction parallel to the first surface S1. As illustrated in FIG. 3, the plane-parallel gas passage 60T has first connection holes 60TC1 in a first wall surface 60TS1 at an upper side, that is, at a side adjacent to the first surface S1, and has a second connection hole 60TC2 in a second wall surface 60TS2 at a lower side, that is, at a side adjacent to the second surface S2. In the following description, the first connection holes 60TC1 and the second connection hole 60TC2 may be generically referred to as connection holes 60TC when it is not necessary to distinguish between them. The first wall surface 60TS1 serves as a facing wall surface positioned at a side facing the second connection hole 60TC2, and also serves as a connection wall surface positioned at a side at which the first connection holes 60TC1 are formed. Similarly, the second wall surface 60TS2 serves as a facing wall surface positioned at a side facing the first connection holes 60TC1, and also serves as a connection wall surface positioned at a side at which the second connection hole 60TC2 is formed.

Each gas inflow/outflow passage 60V is a gas passage portion that extends in the vertical direction, that is, in a direction perpendicular to the first surface S1, and provides communication between the plane-parallel gas passage 60T and one of the gas outlets 61 and the gas inlet 62. As illustrated in FIG. 3, each first gas passage 60V1 is connected to the corresponding gas outlet 61 and to the corresponding first connection hole 60TC1, and the second gas passage 60V2 is connected to the gas inlet 62 and to the second connection hole 60TC2. In the present embodiment, the first connection holes 60TC1 and the second connection hole 60TC2 are positioned so as not to overlap each other when viewed in a direction normal to the first surface S1. The shapes of the gas outlets 61, the gas inlet 62, the first connection holes 60TC1, and the second connection hole 60TC2, and the cross-sectional shape of the gas passage 60 are not limited. In the present embodiment, the shapes are substantially circular. In the present embodiment, each of the first gas passages 60V1 and the second gas passage 60V2 is straight-tube-shaped and has a constant cross-sectional shape on a plane parallel to the first surface S1 (XY cross section). The cross-sectional shape of the first gas passages 60V1 on an XY plane is the same as the shape of the first connection holes 60TC1, and the cross-sectional shape of the second gas passage 60V2 on an XY plane is the same as the shape of the second connection hole 60TC2.

As illustrated in FIG. 2, a chuck electrode 51 is disposed above the plane-parallel gas passage 60T, that is, adjacent to the first surface S1, in the plate-shaped member 10. The chuck electrode 51 has, for example, a planar shape that is substantially parallel to the first surface S1, and is connected to a power supply through a terminal. Electric power is supplied to the chuck electrode 51 as necessary, so that electrostatic attraction is generated and that the wafer W is attracted to and held on the first surface S1. The chuck electrode 51 may be formed of, for example, a conductive material containing tungsten or molybdenum.

As illustrated in FIG. 2, porous bodies 70 are disposed in the gas passage 60 formed in the plate-shaped member 10. The porous bodies 70 are made of an insulating material that allows fluid to flow therethrough. The porous bodies 70 are disposed in the gas passage 60 to reduce large voids extending straight in the vertical direction (direction connecting the wafer W and the base member 20) in the regions accommodating the porous bodies 70 in the gas passage 60. As illustrated in FIG. 3, in the holding device 100 according to the present embodiment, the porous bodies 70 include first porous bodies 71 and a second porous body 72. Each first porous body 71 is disposed in the corresponding first gas passage 60V1 and projects into the plane-parallel gas passage 60T from the corresponding first connection hole 60TC1. The second porous body 72 is disposed in the second gas passage 60V2 and projects into the plane-parallel gas passage 60T from the second connection hole 60TC2.

As illustrated in FIG. 3, each porous body 70 includes a wide portion 70A. On a cross section taken along a plane orthogonal to the first surface S1 (cross section including the Z-axis), a dimension W70 of the wide portion 70A in a direction parallel to the first surface S1 is greater than a hole width W60TC of the connection hole 60TC in which the porous body 70 is disposed. The wide portion 70A is disposed in the plane-parallel gas passage 60T. More specifically, each first porous body 71 includes a wide portion 71A having a dimension W71 in a direction parallel to the first surface S1, the dimension W71 being greater than a hole width W60TC1 of the first connection hole 60TC1. The second porous body 72 includes a wide portion 72A having a dimension W72 in a direction parallel to the first surface S1, the dimension W72 being greater than a hole width W60TC2 of the second connection hole 60TC2.

As illustrated in FIG. 3, each porous body 70 according to the present embodiment is present in a region extending from the connection hole 60TC in which the porous body 70 is disposed to the facing wall surface positioned at the side facing the connection hole 60TC in the plane-parallel gas passage 60T. More specifically, each first porous body 71 in the corresponding first gas passage 60V1 is present in a region extending from the corresponding first connection hole 60TC1 to the second wall surface 60TS2, which serves as the facing wall surface for the first connection hole 60TC1. The second porous body 72 in the second gas passage 60V2 is present in a region extending from the second connection hole 60TC2 to the first wall surface 60TS1, which serves as the facing wall surface for the second connection hole 60TC2.

Figure 4:
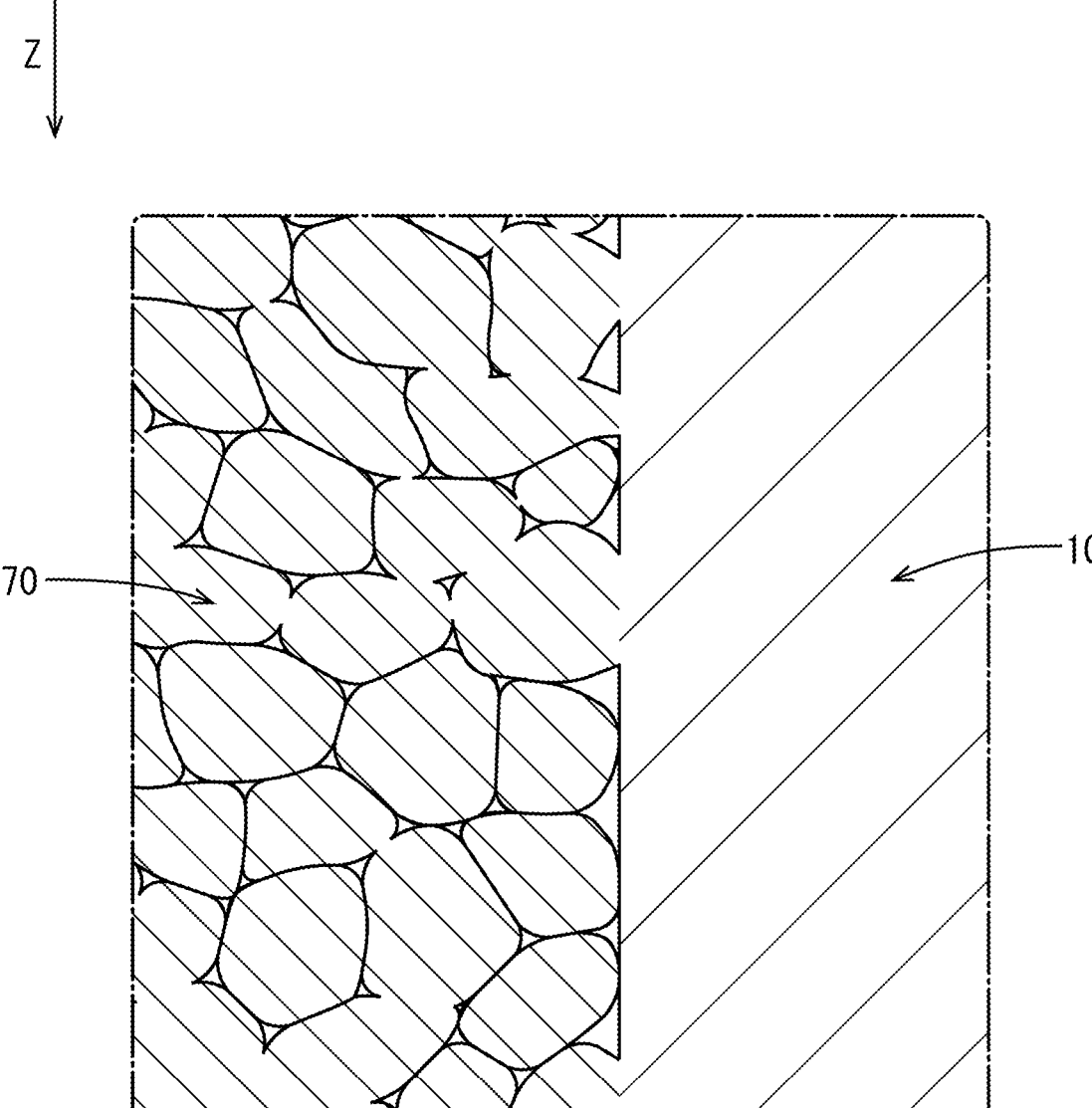
FIG. 4 is a sectional view schematically illustrating an interface between the plate-shaped member (wall surface of a gas passage) and a porous body.

FIG. 4 is a sectional view schematically illustrating an interface between a wall surface of the gas passage 60 formed in the plate-shaped member 10 according to the present embodiment and the porous body 70. As illustrated in FIG. 4, the porous body 70 according to the present embodiment includes solid portions that are at least partially integrated with the plate-shaped member 10. Assuming that, for example, the porous body 70 is made of the same ceramic as that of the plate-shaped member 10, the plate-shaped member 10 can be produced as follows. First, a ceramic substrate in which electrodes including the chuck electrode 51 and the gas passage 60 are provided is prepared by a known method. Then, a porous body precursor composed of, for example, a paste of a ceramic material having an appropriate viscosity is introduced into the gas inflow/outflow passages 60V through the gas outlets 61 and the gas inlet 62 so that a predetermined amount of the porous body precursor enters the plane-parallel gas passage 60T through the connection holes 60TC. Then, the introduced porous body precursor is cured by applying heat, for example, to form the porous bodies. As a result, the solid portions of the porous bodies made of ceramic are formed integrally with the wall surfaces of the gas passage in the ceramic substrate. Thus, the first porous bodies 71 and the second porous body 72 can be formed in the gas passage 60 in the above-described manner. Alternatively, the plate-shaped member 10 may be produced by preparing a plurality of green sheets in each of which grooves and holes that constitute the gas passage 60 are formed, stacking the green sheets while the porous body precursor or the porous bodies 70 are disposed at appropriate positions, and sintering the stack of green sheets, for example. Alternatively, the plate-shaped member 10 may be produced by preparing a plurality blocks obtained by dividing a ceramic substrate and having grooves and holes that constitute the gas passage 60, appropriately placing the porous bodies 70 prepared in advance in the grooves and holes, and then joining the blocks together.

The above-described holding device 100 according to the present embodiment can be manufactured by producing the base member 20 by a known method and joining the separately produced plate-shaped member 10 to the base member 20 with the joining material 30 provided therebetween, as illustrated in FIG. 1. The method for producing the plate-shaped member 10 in which the porous bodies 70 are disposed is not particularly limited, and various known methods, such as those described above, may be employed.

The above-described holding device 100 is used as, for example, a portion of a semiconductor manufacturing apparatus. The holding device 100 is installed in a chamber of the semiconductor manufacturing apparatus, and the wafer W is placed on the first surface S1 of the plate-shaped member 10. When electric power is supplied to the chuck electrode 51, electrostatic attraction is generated so that the wafer W is attracted to the first surface S1. Then, material gas is introduced into the chamber, and high-frequency electric power is applied to the base member 20. As a result, plasma is generated, and the wafer W receives a bias voltage and is processed.

When the wafer W is processed, the refrigerant is caused to flow through the refrigerant passages 21 in the base member 20 to cool the wafer W through the plate-shaped member 10. When the temperature of the wafer W is adjusted in this manner, the thermally conductive gas introduced into the gas passage 60 in the plate-shaped member 10 from the gas introduction passage 23 in the base member 20 flows out through of the gas outlets 61 in the first surface S1 and fills the gap G between the first surface S1 and the wafer W. Thus, the temperature of the wafer W is accurately controlled.

As described above, when the wafer W is processed, high-frequency electric power is applied to the base member 20. Therefore, there is a possibility that abnormal discharge will occur in the gas passage 60 in the plate-shaped member 10 positioned between the wafer W and the base member 20. In particular, abnormal discharge easily occurs in the gas inflow/outflow passages 60V extending in the direction connecting the wafer W and the base member 20 (Z-axis direction). In the plate-shaped member 10 according to the present embodiment, the porous bodies 70, which have insulating properties, are disposed in the gas inflow/outflow passages 60V. Therefore, the occurrence of abnormal discharge in the gas inflow/outflow passages 60V is reduced.

The chamber is under vacuum while the wafer W is being processed. In other words, the chamber is evacuated before the process, and returned to normal pressure after the process. A certain pressure is applied to the inside of the gas passage 60 so that the thermally conductive gas flows through the gas passage 60. Therefore, the porous bodies 70 disposed in the gas inflow/outflow passages 60V receive force in a direction toward the first surface S1 or the second surface S2.

Assume that a gas passage having a structure similar to that of the gas passage 60 according to the present embodiment is formed in a plate-shaped member and that porous bodies having no wide portions are disposed in regions corresponding to the gas inflow/outflow passages 60V. In this case, unless the porous bodies are fixed to wall surfaces of the gas passage, there is a possibility that the porous bodies will be released from the gas passage to the outside of the plate-shaped member. This can be avoided by, for example, fixing the porous bodies to the wall surfaces of the gas passage with a resin adhesive. However, the resin adhesive may be damaged in the plasma process and generate particles that adversely affect the process.

Advantages of Present Embodiment

The holding device 100 according to the present embodiment includes the plate-shaped member 10 that has insulating properties and that has the first surface S1 and the second surface S2, the first surface S1 being configured to hold the wafer (object) W, the second surface S2 being at a side opposite to a side of the first surface S1. The plate-shaped member 10 includes the plane-parallel gas passage 60T, the first gas passage 60V1, and the second gas passage 60V2. The plane-parallel gas passage 60T extends parallel to the first surface S1. The first gas passage 60V1 is connected to the first connection hole 60TC1 provided in a wall surface of the plane-parallel gas passage 60T, and provides communication between the gas outlet 61 provided in the first surface S1 and the plane-parallel gas passage 60T. The second gas passage 60V2 is connected to the second connection hole 60TC2 provided in a wall surface of the plane-parallel gas passage 60T, and provides communication between the gas inlet 62 provided in the second surface S2 and the plane-parallel gas passage 60T. The porous body 70 that has insulating properties is disposed in at least one of the first gas passage 60V1 or the second gas passage 60V2. The porous body 70 projects into the plane-parallel gas passage 60T from the first connection hole 60TC1 or the second connection hole 60TC2. The porous body 70 includes the wide portion 70A. The dimension W70 of the wide portion 70A in a direction parallel to the first surface S1 on a cross section taken along a plane orthogonal to the first surface S1 is greater than the hole width W60TC of the first connection hole 60TC1 or the second connection hole 60TC2 in which the porous body 70 is disposed. The wide portion 70A is disposed in the plane-parallel gas passage 60T.

According to the above-described structure, when the porous body 70 disposed in the gas inflow/outflow passage 60V receives a force that tries to push the porous body 70 out of the gas passage 60 in a direction away from the plane-parallel gas passage 60T, the wide portion 70A is stopped by the edge of the connection hole 60TC in which the porous body 70 is disposed. More specifically, when the first porous body 71 disposed in the first gas passage 60V1 receives a force that tries to push out the first porous body 71 from the first surface S1, the wide portion 71A is stopped by the edge of the first connection hole 60TC1. When the second porous body 72 disposed in the second gas passage 60V2 receives a force that tries to push out the second porous body 72 from the second surface S2, the wide portion 72A is stopped by the edge of the second connection hole 60TC2. Therefore, even when the porous body 70 receives a relatively large force as described above, the porous body 70 is not pushed out of the plate-shaped member 10 from a surface in a direction away from the plane-parallel gas passage 60T unless, for example, the porous body 70 breaks. As a result, the porous body 70 can be held in the gas passage 60 without using a resin adhesive or the like.

In the holding device 100 according to the present embodiment, the first connection hole 60TC1 and the second connection hole 60TC2 are disposed at positions shifted from each other when viewed in the direction normal to the first surface S1.

According to the above-described structure, the plane-parallel gas passage 60T has a wall surface (the first wall surface 60TS1 or the second wall surface 60TS2) that faces the connection hole 60TC. Therefore, even when the porous body 70 disposed in the gas inflow/outflow passage 60V receives a force that tries to push out the porous body 70 in a direction toward the plane-parallel gas passage 60T, the wall surface of the plane-parallel gas passage 60T facing the connection hole 60TC in which the porous body 70 is disposed prevents the porous body 70 from being released. More specifically, when the first porous body 71 disposed in the first gas passage 60V1 receives a force that tries to push out the first porous body 71 in a direction toward the second surface S2, the second wall surface 60TS2 facing the first connection hole 60TC1 prevents the first porous body 71 from being released downward. When the second porous body 72 disposed in the second gas passage 60V2 receives a force that tries to push out the second porous body 72 in a direction toward the first surface S1, the first wall surface 60TS1 facing the second connection hole 60TC2 prevents the second porous body 72 from being released upward. Therefore, the porous body 70 is not pushed out of the plate-shaped member 10 from a surface in a direction toward the plane-parallel gas passage 60T unless, for example, the porous body 70 breaks. As a result, the porous body 70 can be prevented from being released from the gas passage 60 without using a resin adhesive or the like.

In the holding device 100 according to the present embodiment, the porous body 70 is present in a region extending from the first connection hole 60TC1 or the second connection hole 60TC2 in which the porous body 70 is disposed to the facing wall surface (the second wall surface 60TS2 or the first wall surface 60TS1) positioned at the side facing the first connection hole 60TC1 or the second connection hole 60TC2 in which the porous body 70 is disposed in the plane-parallel gas passage 60T. In other words, in the plane-parallel gas passage 60T, the porous body 70 is integrated with the facing wall surface facing the connection hole 60TC in which the porous body 70 is disposed.

According to the above-described structure, when the porous body 70 disposed in the gas inflow/outflow passage 60V receives a force that tries to move the porous body 70 in the direction toward the plane-parallel gas passage 60T, the wall surface (the first wall surface 60TS1 or the second wall surface 60TS2) facing the connection hole 60TC in which the porous body 70 is disposed prevents the porous body 70 from moving. More specifically, when the first porous body 71 disposed in the first gas passage 60V1 receives a force that tries to move the first porous body 71 in the direction toward the second surface S2, the second wall surface 60TS2, which is the facing wall surface for the first connection hole 60TC1, prevents the first porous body 71 from moving downward. When the second porous body 72 disposed in the second gas passage 60V2 receives a force that tries to move the second porous body 72 in the direction toward the first surface S1, the first wall surface 60TS1, which is the facing wall surface for the second connection hole 60TC2, prevents the second porous body 72 from moving upward. Therefore, even when the force is relatively large, the porous body 70 does not move unless, for example, the porous body 70 collapses. As a result, the porous body 70 is not easily moved in the direction toward the plane-parallel gas passage 60T in the gas passage 60, and can be reliably held in the gas passage 60 without using a resin adhesive or the like.

In the holding device 100 according to the present embodiment, the porous body 70 is integrated with the plate-shaped member 10.

According to the above-described structure, since the porous body 70 is integrated with the plate-shaped member 10, the porous body 70 is not easily moved not only in the directions toward the first surface S1 and the second surface S2 but also in other directions in the gas passage 60. As a result, generation of particles due to rubbing or the like of the porous body 70 can be further reduced. To integrate the porous body 70 and the plate-shaped member 10 together without using a resin adhesive layer, the porous body 70 and the plate-shaped member 10 are preferably made of the same type of material. More specifically, the porous body 70 and the plate-shaped member 10 may both be formed of a ceramic material.

Detailed Description of Second Embodiment

A plate-shaped member 210 included in a holding device according to a second embodiment will now be described with reference to FIG. 5. A gas passage 60 formed in the plate-shaped member 210 accommodates porous bodies 270 having a shape different from that in the plate-shaped member 10 according to the first embodiment. Other structures are the same as those in the plate-shaped member 10 according to the first embodiment. The same structures are denoted by the same reference signs, and description thereof is thus omitted.

As illustrated in FIG. 5, in the plane-parallel gas passage 60T, each porous body 270 according to the present embodiment is present in a region extending from the connection hole 60TC in which the porous body 270 is disposed along the connection wall surface positioned at a side at which the connection hole 60TC is formed. In other words, the porous body 270 is integrated with the wall surface having the connection hole 60TC in which the porous body 270 is disposed in the plane-parallel gas passage 60T. More specifically, each first porous body 271 in the corresponding first gas passage 60V1 includes a wide portion 271A present in a region extending from the corresponding first connection hole 60TC1 along the first wall surface 60TS1, which serves as the connection wall surface for the first connection hole 60TC1. A second porous body 272 in the second gas passage 60V2 has a wide portion 272A present in a region extending from the second connection hole 60TC2 along the second wall surface 60TS2, which serves as the connection wall surface for the second connection hole 60TC2.

Advantages of Present Embodiment

As described above, in the holding device according to the present embodiment, each porous body 270 is present in a region extending along the connection wall surface (the first wall surface 60TS1 or the second wall surface 60TS2) having the first connection hole 60TC1 or the second connection hole 60TC2 in which the porous body 270 is disposed in the plane-parallel gas passage 60T.

According to the above-described structure, when the porous body 270 disposed in the gas inflow/outflow passage 60V receives a force that tries to move the porous body 270 in the direction away from the plane-parallel gas passage 60T, the wall surface (the first wall surface 60TS1 or the second wall surface 60TS2) having the connection hole 60TC in which the porous body 270 is disposed prevents the porous body 270 from moving. More specifically, when the first porous body 271 disposed in the first gas passage 60V1 receives a force that tries to move the first porous body 271 in the direction toward the first surface S1, the first wall surface 60TS1, which serves as the connection wall surface for the first connection hole 60TC1, prevents the first porous body 271 from moving upward. When the second porous body 272 disposed in the second gas passage 60V2 receives a force that tries to move the second porous body 272 in the direction toward the second surface S2, the second wall surface 60TS2, which serves as the connection wall surface for the second connection hole 60TC2, prevents the second porous body 272 from moving downward. Therefore, even when the force is relatively large, the porous body 270 is not moved by this force unless, for example, the porous body 270 collapses. As a result, the porous body 270 is not easily moved in the direction away from the plane-parallel gas passage 60T in the gas passage 60, and can be reliably held in the gas passage 60 without using a resin adhesive or the like.

Detailed Description of Third Embodiment

Figure 6:
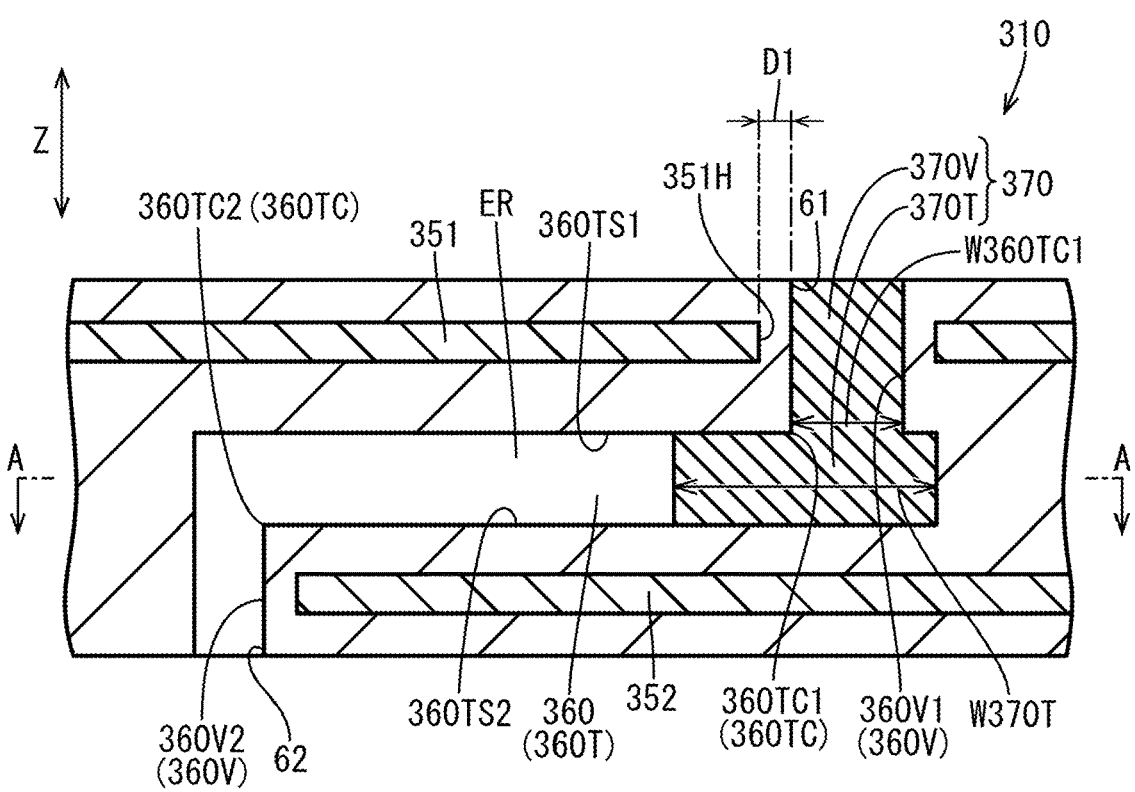
FIG. 6 is an enlarged sectional view of a part of a plate-shaped member according to a third embodiment in which a porous body is disposed.
Figure 7:
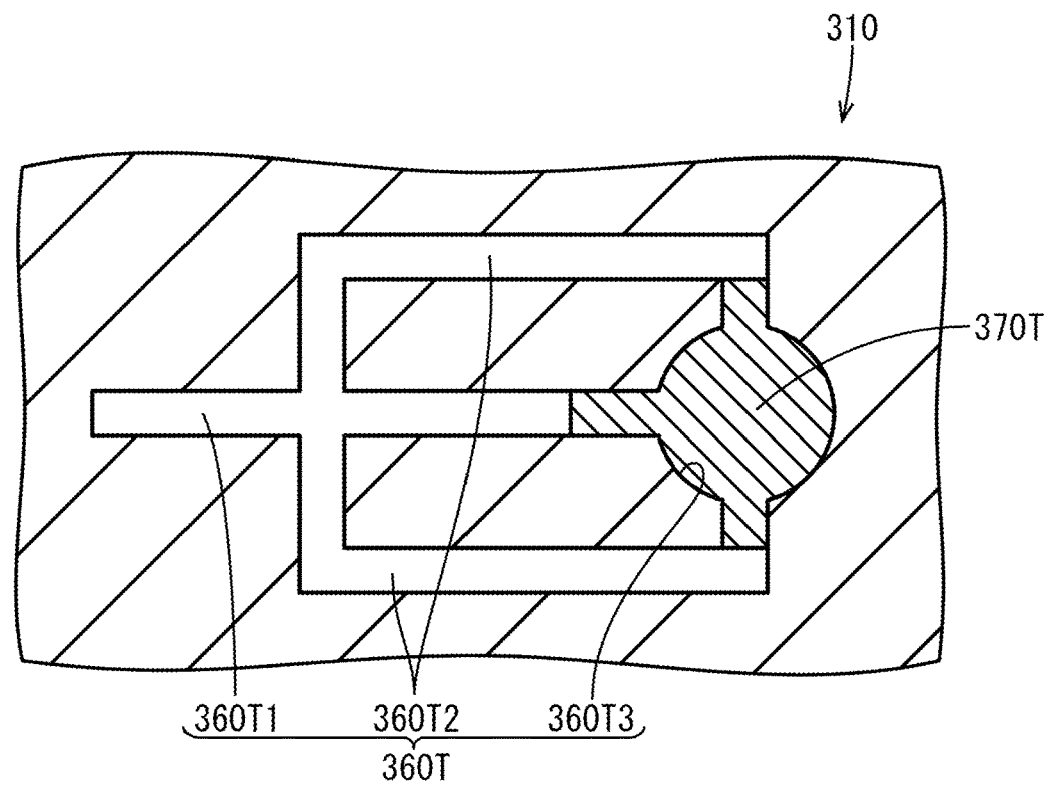
FIG. 7 is a sectional view of FIG. 6 taken along line A-A.

A plate-shaped member 310 included in a holding device according to a third embodiment will now be described with reference to FIGS. 6 and 7. A gas passage 360 formed in the plate-shaped member 310 has a shape different from that in the plate-shaped member 10 according to the first embodiment. Structures that are the same as those in the plate-shaped member 10 according to the first embodiment are denoted by the same reference signs, and description thereof is omitted.

The gas passage 360 that provides communication between the gas outlet 61 and the gas inlet 62 is formed in the plate-shaped member 310. As illustrated in FIG. 6, the gas passage 360 according to the present embodiment includes a plane-parallel gas passage 360T, a first gas passage 360V1, and a second gas passage 360V2. In the following description, the first gas passage 360V1 and the second gas passage 360V2 will be generically referred to as gas inflow/outflow passages 360V when it is not necessary to distinguish between them.

The plane-parallel gas passage 360T is a tunnel-shaped gas passage portion extending in a horizontal direction, that is, in a direction parallel to the first surface S1. The plane-parallel gas passage 360T has a first connection hole 360TC1 in a first wall surface 360TS1 at an upper side, that is, at a side adjacent to the first surface S1, and has a second connection hole 360TC2 in a second wall surface 360TS2 at a lower side, that is, at a side adjacent to the second surface S2. In the following description, the first connection hole 360TC1 and the second connection hole 360TC2 may be generically referred to as connection holes 360TC when it is not necessary to distinguish between them. The first wall surface 360TS1 serves as a facing wall surface positioned at a side facing the second connection hole 360TC2, and also serves as a connection wall surface positioned at a side at which the first connection hole 360TC1 is formed. Similarly, the second wall surface 360TS2 serves as a facing wall surface positioned at a side facing the first connection hole 360TC1, and also serves as a connection wall surface positioned at a side at which the second connection hole 360TC2 is formed.

Each gas inflow/outflow passage 360V is a gas passage portion that extends in the vertical direction, that is, in a direction perpendicular to the first surface S1, and provides communication between the plane-parallel gas passage 360T and one of the gas outlet 61 and the gas inlet 62. The first gas passage 360V1 is connected to the gas outlet 61 and to the first connection hole 360TC1, and the second gas passage 360V2 is connected to the gas inlet 62 and to the second connection hole 360TC2. In the present embodiment, the first connection hole 360TC1 and the second connection hole 360TC2 are positioned so as not to overlap each other when viewed in the direction normal to the first surface S1. The shapes of the gas outlet 61, the gas inlet 62, the first connection hole 360TC1, and the second connection hole 360TC2, and the cross-sectional shape of the gas passage 360 are not limited. In the present embodiment, the shapes are substantially circular. In the present embodiment, each of the first gas passage 360V1 and the second gas passage 360V2 is straight-tube-shaped and has a constant cross-sectional shape on a plane parallel to the first surface S1 (XY cross section). The cross-sectional shape of the first gas passage 360V1 on an XY plane is the same as the shape of the first connection hole 360TC1, and the cross-sectional shape of the second gas passage 360V2 on an XY plane is the same as the shape of the second connection hole 360TC2. In the present embodiment, the first gas passage 360V1 has an inner diameter greater than that of the second gas passage 360V2. However, the first gas passage 360V1 may have an inner diameter that is the same as that of the second gas passage 360V2 or less than that of the second gas passage 360V2.

The plate-shaped member 310 includes therein a first electrode 351 disposed above the plane-parallel gas passage 360T, that is, at a position adjacent to the first surface S1, and a second electrode 352 disposed below the plane-parallel gas passage 360T, that is, at a position adjacent to the second surface S2. Thus, the plane-parallel gas passage 360T is disposed between the first electrode 351 and the second electrode 352 in the vertical direction. The first electrode 351 and the second electrode 352 are made of, for example, a conductive material containing tungsten, molybdenum, or the like. In the present embodiment, the first electrode 351 has a planar shape that is substantially parallel to the first surface S1, and functions as a chuck electrode for generating electrostatic attraction so that the wafer W, for example, is attracted to the first surface S1. In this case, the first electrode 351 is connected to a power supply through, for example, a terminal, and electric power is supplied to the first electrode 351 as appropriate so that the wafer W is attracted to and held on the first surface S1. In the present embodiment, the second electrode 352 also has a planar shape that is substantially parallel to the first surface S1. The second electrode 352 may, for example, be a heater electrode that is composed of a heating resistor and connected to the power supply through, for example, a terminal.

The first electrode 351 having a planar shape has a first through hole 351H at a position directly above the first connection hole 360TC1 in the plane-parallel gas passage 360T disposed therebelow. The first through hole 351H is somewhat larger than the first connection hole 360TC1. The first gas passage 360V1 extends through a central region of the first through hole 351H. The edge of the first through hole 351H is separated from a wall surface of the first gas passage 360V1 by a predetermined interval D1. In other words, the first electrode 351 is separated from the wall surface of the first gas passage 360V1 by the predetermined interval D1. If the first electrode 351 made of a conductive material is exposed in the first gas passage 360V1 or in the vicinity of the first gas passage 360V1, the first electrode 351 serves as a discharge object when high-frequency electric power is applied. Therefore, the first electrode 351 and the wall surface of the first gas passage 360V1 need to have a predetermined interval therebetween. The materials of the first electrode 351, the second electrode 352, and the plate-shaped member 310 may be set as appropriate depending on the expected conditions of the plasma process.

A porous body 370 is disposed in the gas passage 360 formed in the plate-shaped member 310. The porous body 370 is made of an insulating material that allows thermally conductive gas to pass therethrough. The porous body 370 is disposed in the gas passage 360 to reduce a large void extending straight in the vertical direction (direction connecting the wafer W and the base member 20) in the region accommodating the porous body 370 in the gas passage 360. In the holding device 300 according to the present embodiment, the porous body 370 is disposed in the first gas passage 360V1 and projects into the plane-parallel gas passage 360T from the first connection hole 360TC1.

The porous body 370 includes an inflow/outflow-passage porous body portion 370V disposed in the first gas passage 360V1 and a parallel-passage porous body portion 370T disposed in the plane-parallel gas passage 360T. The parallel-passage porous body portion 370T corresponds to a "wide portion" described in the claims. In the present embodiment, the inflow/outflow-passage porous body portion 370V and the parallel-passage porous body portion 370T are formed integrally with each other. A portion extending continuously from the inflow/outflow-passage porous body portion 370V projects into the plane-parallel gas passage 360T through the first connection hole 360TC1 and serves as the parallel-passage porous body portion 370T. The parallel-passage porous body portion 370T is formed to overlap the first through hole 351H in the first electrode 351 when viewed in the direction normal to the first surface S1. In the present embodiment, the plane-parallel gas passage 360T has a hollow region ER in which the porous body 370 is not disposed at a position that does not overlap the first through hole 351H when viewed in the direction normal to the first surface S1.

A dimension W370T of the parallel-passage porous body portion 370T in a direction parallel to the first surface S1 on a cross section taken along a plane orthogonal to the first surface S1 (cross section including the Z-axis) is greater than a hole width W360TC1 of the first connection hole 360TC1.

As described above, thermally conductive gas, such as helium gas, flows through the gas passage 360 in the plate-shaped member 310. The porous body 370 allows the thermally conductive gas to pass therethrough. However, as the flow rate increases, pressure loss increases, and the ease of temperature control is expected to be reduced. Accordingly, as illustrated in FIG. 7, the plane-parallel gas passage 360T according to the present embodiment includes a porous-body passage 360T3, a first plane-parallel gas passage 360T1, and second plane-parallel gas passages 360T2. The porous-body passage 360T3 accommodates the parallel-passage porous body portion 370T of the porous body 370. The first plane-parallel gas passage 360T1 provides communication between the second connection hole 360TC2 and the porous-body passage 360T3. The second plane-parallel gas passages 360T2 branches from the first plane-parallel gas passage 360T1 and is connected to the porous-body passage 360T3 at positions different from the first plane-parallel gas passage 360T1. The second plane-parallel gas passages 360T2 provide connection between the first plane-parallel gas passage 360T1 and the porous-body passage 360T3.

The first plane-parallel gas passage 360T1 has a straight shape. The second plane-parallel gas passages 360T2 are substantially gate-shaped and arranged one on each side of the first plane-parallel gas passage 360T1. The pair of second plane-parallel gas passages 360T2 are disposed symmetrical about the first plane-parallel gas passage 360T1. The first plane-parallel gas passage 360T1 provides communication between the second connection hole 360TC2 and the porous-body passage 360T3. The second plane-parallel gas passages 360T2 provides communication between the first plane-parallel gas passage 360T1 and the porous-body passage 360T3.

The porous-body passage 360T3 has a circular shape that is coaxial with the first gas passage 360V1 and somewhat larger than the first gas passage 360V1 when viewed in the direction normal to the first surface S1. The plane-parallel gas passages 360T1 and 360T2 are connected to the porous-body passage 360T3 at positions spaced from each other by 90° around the center of the porous-body passage 360T3. End portions of the pair of second plane-parallel gas passages 360T2 are connected to the top and bottom ends of the porous-body passage 360T3 in FIG. 7, and an end portion of the first plane-parallel gas passage 360T1 is connected to the left end of the porous-body passage 360T3 in FIG. 7. The parallel-passage porous body portion 370T partially extends into each of the plane-parallel gas passages 360T1 and 360T2.

According to the above-described structure, since the pair of second plane-parallel gas passages 360T2 are formed, the cross-sectional area of the flow passage is increased accordingly compared to when only the first plane-parallel gas passage 360T1 is formed. Therefore, pressure loss can be reduced, and temperature control can be facilitated.

The inflow/outflow-passage porous body portion 370V reduces the occurrence of abnormal discharge in the first gas passage 360V1. The parallel-passage porous body portion 370T reduces the occurrence of abnormal discharge in the plane-parallel gas passage 360T in a region in which no electrode can be disposed above and below to ensure insulation of the electrode. Accordingly, in the plane-parallel gas passage 360T, the porous body 370 is disposed in a region around the first connection hole 360TC1, and the first electrode 351 and the second electrode 352 are disposed above and below other regions. Thus, the occurrence of abnormal discharge can be reduced over the entire region of the plane-parallel gas passage 360T. It is not necessary that the pair of upper and lower electrodes be provided. The occurrence of abnormal discharge can also be reduced when only one of the first electrode 351 and the second electrode 352 is provided.

Detailed Description of Fourth Embodiment

Figure 8:
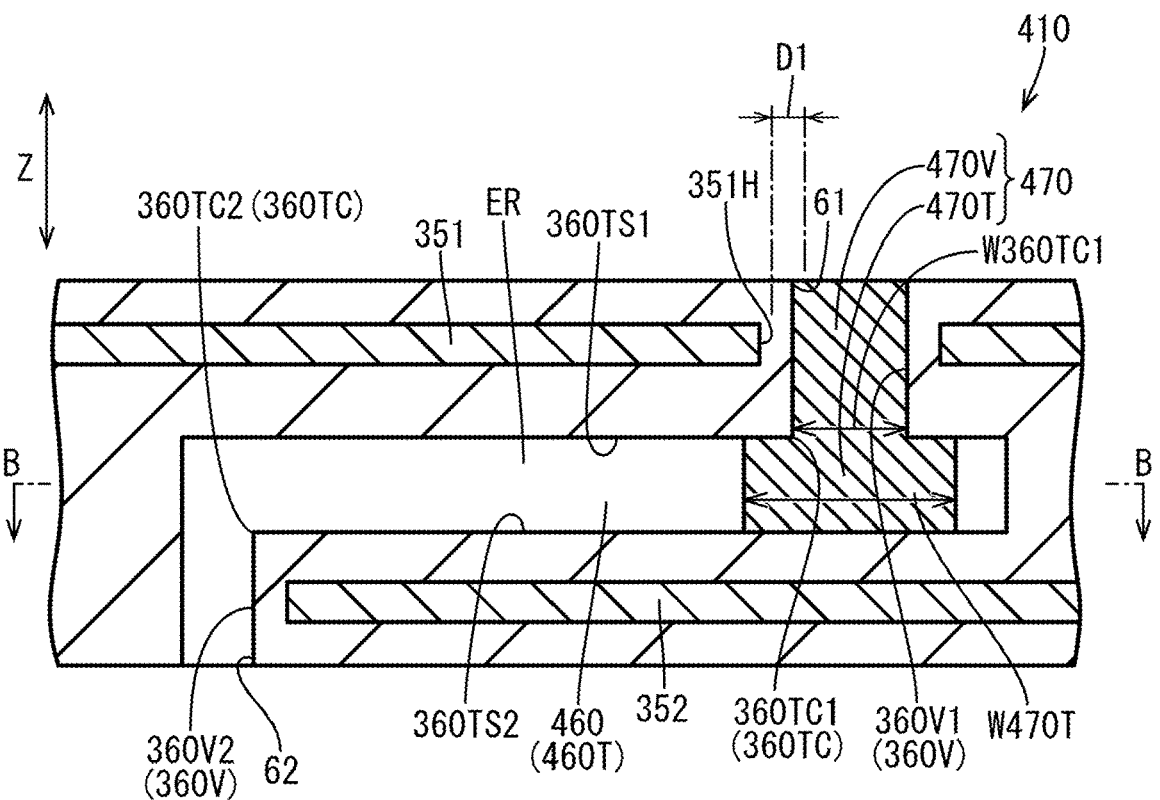
FIG. 8 is an enlarged sectional view of a part of a plate-shaped member according to a fourth embodiment in which a porous body is disposed.
Figure 9:
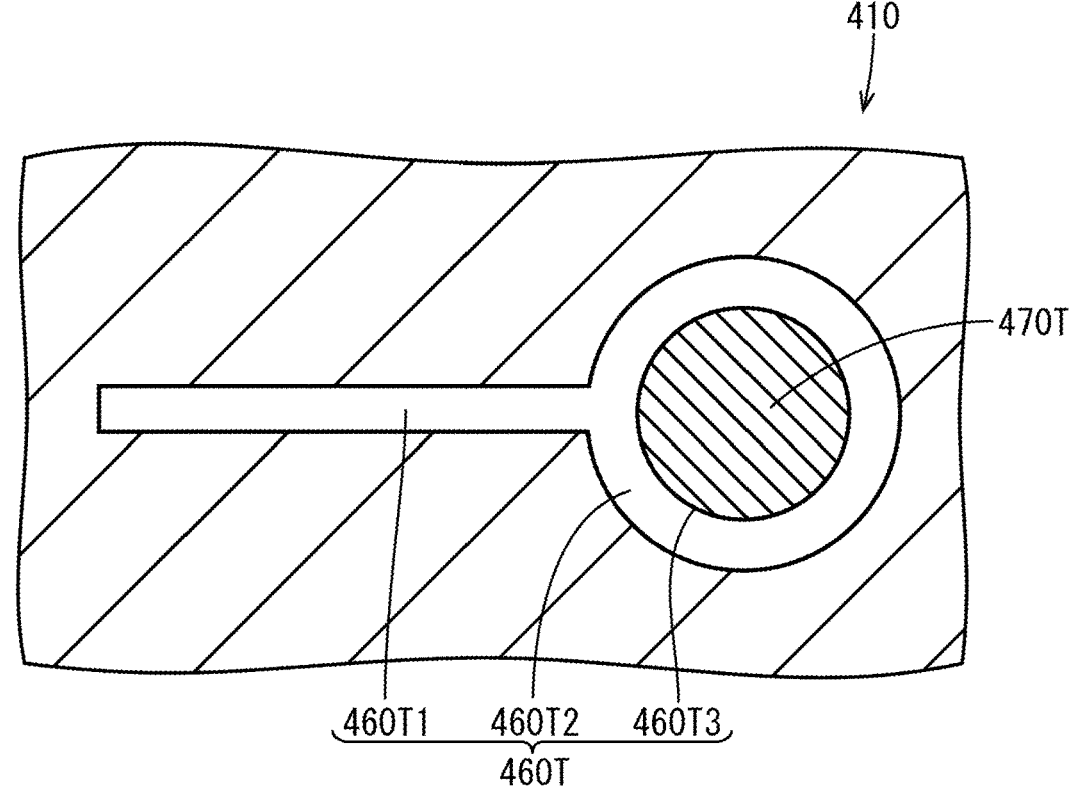
FIG. 9 is a sectional view of FIG. 8 taken along line B-B.

A plate-shaped member 410 included in a holding device according to a fourth embodiment will now be described with reference to FIGS. 8 and 9. A plane-parallel gas passage 460T formed in the plate-shaped member 410 has a shape different from that in the plate-shaped member 310 according to the third embodiment. Structures that are the same as those in the plate-shaped member 310 according to the third embodiment are denoted by the same reference signs, and description thereof is omitted.

The plane-parallel gas passage 460T according to the present embodiment includes a first plane-parallel gas passage 460T1, a second plane-parallel gas passage 460T2, and a porous-body passage 460T3. A porous body 470 includes an inflow/outflow-passage porous body portion 470V disposed in the first gas passage 360V1 and a parallel-passage porous body portion 470T disposed in the plane-parallel gas passage 460T. The parallel-passage porous body portion 470T corresponds to a "wide portion" described in the claims. The parallel-passage porous body portion 470T is formed to overlap the first through hole 351H in the first electrode 351 when viewed in the direction normal to the first surface S1. A dimension W470T of the parallel-passage porous body portion 470T in a direction parallel to the first surface S1 on a cross section taken along a plane orthogonal to the first surface S1 (cross section including the Z-axis) is greater than the hole width W360TC1 of the first connection hole 360TC1. As illustrated in FIG. 9, the second plane-parallel gas passage 460T2 is annular-shaped and extends along the outer edge of the parallel-passage porous body portion 470T from an end of the first plane-parallel gas passage 460T1 adjacent to the parallel-passage porous body portion 470T.

According to the above-described structure, thermally conductive gas, such as helium gas, can flow along the entire circumference of the parallel-passage porous body portion 470T, so that the contact area between the thermally conductive gas and the parallel-passage porous body portion 470T is greater than that between the thermally conductive gas and the plane-parallel gas passage 360T according to the third embodiment. Therefore, the pressure loss can be further reduced, and temperature control can be further facilitated.

Other Embodiments (1) In the above-described first and second embodiments, the porous bodies 70 are disposed in all of the first gas passages 60V1 and the second gas passage 60V2. However, the structure is not limited to this. As long as one or more of the gas inflow/outflow passages 60V have the porous bodies disposed therein, the occurrence of abnormal discharge in the gas passage can be reduced compared to when the holding device has no porous bodies. When the porous bodies have a shape according to the present disclosure, the porous bodies can be prevented from being released from the gas passage 60.

(2) The base member is not limited to those having a gas introduction passage formed therein. For example, the second surface S2 of the plate-shaped member 10 may have a groove extending from the gas inlet 62 to the outer periphery, and thermally conductive gas may be introduced through this groove and guided into the gas passage 60. The base member is not limited to those having refrigerant passages formed therein. Preferably, the base member is made of a material having a high thermal conductivity and includes any type of cooling mechanism, such as a cooling fin.

(3) In the above-described first and second embodiments, a heater electrode that is composed of a heating resistor and connected to the power supply through, for example, a terminal may be provided in the plate-shaped member 10. The heater electrode may be disposed above the plane-parallel gas passage 60T and between the plane-parallel gas passage 60T and the chuck electrode 51, or below the plane-parallel gas passage 60T, that is, adjacent to the second surface S2. The heater electrode may be arranged in a plurality of layers. The heater electrode is formed in the shape of, for example, concentric circles or a helical line when viewed in the direction normal to the first surface S1, and is connected to the power supply through, for example, a terminal. Electric power is supplied to the heater electrode as necessary, so that the plate-shaped member 10 is heated to heat the wafer W held on the first surface S1 of the plate-shaped member 10. The temperature of the wafer W can be controlled by adjusting the electric power supplied to the heater electrode. Similarly to the chuck electrode 51, the heater electrode may be formed of, for example, a conductive material containing tungsten or molybdenum.

(4) The materials of the members of the holding device according to the above-described embodiments are merely examples, and the members may be made of other materials. The method for manufacturing the holding device according to the above-described embodiments is merely an example, and may be modified in various ways.

(5) The present disclosure is not limited to electrostatic chucks described as examples in the above-described embodiments, and is also applicable to other holding devices (for example, a heating device) for holding an object on a surface of a ceramic base material.

(6) In the above-described third and fourth embodiments, a heater electrode that is composed of a heating resistor and connected to the power supply through, for example, a terminal may be provided in the plate-shaped member 310, 410 in addition to the first electrode 351 and the second electrode 352. Electric power is supplied to the heater electrode as necessary, so that the plate-shaped member 310, 410 is heated to heat the wafer W held on the first surface S1 of the plate-shaped member 310, 410. The temperature of the wafer W can be controlled by adjusting the electric power supplied to the heater electrode. In the above-described third and fourth embodiments, the first electrode 351 functions as a chuck electrode. However, the first electrode 351 is not limited to this. A chuck electrode may be provided in addition to the first electrode 351.

(7) In the above-described third and fourth embodiments, the porous body 370, 470 is disposed in the first gas passage 360V1. However, the porous body 370, 470 is not limited to this. The porous body 370, 470 may be disposed in the second gas passage 360V2 or in each of the first gas passage 360V1 and the second gas passage 360V2.

REFERENCE SIGNS LIST

100 holding device
10, 210, 310, 410 plate-shaped member
20 base member
21 refrigerant passage
23 gas introduction passage
30 joining material
51 chuck electrode
60, 360, 460 gas passage
60T, 360T, 460T plane-parallel gas passage
60TS1 first wall surface (facing wall surface for second connection hole, connection wall surface for first connection hole)
60TS2 second wall surface (facing wall surface for first connection hole, connection wall surface for second connection hole)
60TC, 360TC connection hole
60TC1, 360TC1 first connection hole
60TC2, 360TC2 second connection hole
60V, 360V gas inflow/outflow passage
60V1, 360V1 first gas passage
60V2, 360V2 second gas passage
61 gas outlet
62 gas inlet
70, 270, 370, 470 porous body
71, 271 first porous body
72, 272 second porous body
70A, 71A, 72A, 270A, 271A wide portion
351 first electrode
351H through hole
352 second electrode
360T1, 460T1 first plane-parallel gas passage
360T2, 460T2 second plane-parallel gas passage
360T3, 460T3 porous-body passage
370T, 470T parallel-passage porous body portion (wide portion)
370V, 470V inflow/outflow-passage porous body portion
S1 first surface
S2 second surface
G gap
W70 dimension (of porous body in direction parallel to first surface on cross section)

W71 dimension (of first porous body in direction parallel to first surface on cross section)

W72 dimension (of second porous body in direction parallel to first surface on cross section)

W wafer (object)

What is claimed is:

1. A holding device comprising:

a plate-shaped member that has insulating properties and that has a first surface and a second surface, the first surface being configured to hold an object, the second surface being at a side opposite to a side of the first surface, wherein the plate-shaped member includes therein:

a plane-parallel gas passage extending parallel to the first surface;

a first gas passage connected to a first connection hole provided in a wall surface of the plane-parallel gas passage, the first gas passage providing communication between a gas outlet provided in the first surface and the plane-parallel gas passage; and a second gas passage connected to a second connection hole provided in a wall surface of the plane-parallel gas passage, the second gas passage providing communication between a gas inlet provided in the second surface and the plane-parallel gas passage, wherein a porous body that has insulating properties is disposed in at least one of the first gas passage or the second gas passage, the porous body projecting into the plane-parallel gas passage from the first connection hole or the second connection hole, wherein the porous body includes a wide portion, a dimension of the wide portion in a direction parallel to the first surface on a cross section taken along a plane orthogonal to the first surface is greater than a hole width of the first connection hole or the second connection hole in which the porous body is disposed, and wherein the wide portion is disposed in the plane-parallel gas passage.

2. The holding device according to claim 1, wherein the first connection hole and the second connection hole are disposed at positions shifted from each other when viewed in a direction normal to the first surface.

3. The holding device according to claim 2, wherein the porous body is present in a region extending from the first connection hole or the second connection hole in which the porous body is disposed to a facing wall surface positioned at a side facing the first connection hole or the second connection hole in which the porous body is disposed in the plane-parallel gas passage.

4. The holding device according to claim 3, wherein, in the plane-parallel gas passage, the porous body is present in a region extending along a connection wall surface positioned at a side at which the first connection hole or the second connection hole in which the porous body is disposed is formed.

5. The holding device according to claim 1, wherein the porous body is integrated with the plate-shaped member.

6. The holding device according to claim 1, wherein the plane-parallel gas passage includes:

a porous-body passage in which the porous body is disposed;

a first plane-parallel gas passage that provides communication between the first connection hole and the porous-body passage or between the second connection hole and the porous-body passage; and a second plane-parallel gas passage that branches from the first plane-parallel gas passage and that is connected to the porous-body passage at a position different from the first plane-parallel gas passage, the second plane-parallel gas passage providing communication between the first plane-parallel gas passage and the porous-body passage.

7. The holding device according to claim 6, wherein the second plane-parallel gas passage is loop-shaped and extends along an outer edge of the wide portion from an end of the first plane-parallel gas passage, the end being adjacent to the wide portion.

8. The holding device according to claim 1, wherein the plate-shaped member includes therein at least one of an electrode disposed between the first surface and the plane-parallel gas passage and an electrode disposed between the second surface and the plane-parallel gas passage, wherein the at least one of the electrodes has a through hole through which the first gas passage or the second gas passage passes with a predetermined interval provided between the at least one of the electrodes and a wall surface of the first gas passage or the second gas passage, and wherein the wide portion is disposed in the plane-parallel gas passage to overlap the through hole when viewed in a direction normal to the first surface.

* * * * *